United States Patent [19]

Schmall

[11] 4,079,438
[45] Mar. 14, 1978

[54] PUSH-ON-HANDLES

[75] Inventor: Karl-Heinz Schmall, Baden-Baden, Germany

[73] Assignee: Precitec Gesellschaft fur Prayisionstechnik und Electronik mbH & Co., Entwicklungs-und etc., Baden-Baden, Germany

[21] Appl. No.: 694,728

[22] Filed: Jun. 10, 1976

[30] Foreign Application Priority Data

Jun. 14, 1975 Germany .............................. 2526700

[51] Int. Cl.² .............................................. H02B 1/02
[52] U.S. Cl. .................................. 361/399; 16/114 R
[58] Field of Search .................. 317/101 DH; 211/41; 16/114; 361/399, 415

[56] References Cited

U.S. PATENT DOCUMENTS

| 3,573,558 | 4/1971 | Babcock | 317/101 DH |
| 3,603,845 | 9/1971 | Beers | 317/101 DH |

FOREIGN PATENT DOCUMENTS 897,999  6/1962  United Kingdom ......... 317/101 DH

Primary Examiner—David Smith, Jr.
Attorney, Agent, or Firm—Larson, Taylor and Hinds

[57] ABSTRACT

The push-on handle of a circuit board is provided with a lateral extension forming a supporting element on which may be mounted further circuit elements, especially elements which in use should be accessible. The lateral extension may be integral with the handle or may be fixed thereon by complementary interengaging grooves and ribs or by any other conventional means.

5 Claims, 4 Drawing Figures

PUSH-ON-HANDLES

FIELD OF THE INVENTION

The invention is concerned with a push-on handle for a conductor plate or circuit board, the handle having a slot to receive the board. Such handles are used to insert circuit boards into electronic apparatus and may be formed as to receive marking labels.

PRIOR ART

Various forms and embodiments of such handles are known, and are described in, for example, German Patent Specification No. P23 29 669.7.

SUMMARY OF THE INVENTION

According to the present invention, a push-on handle for a circuit board is formed with a slot for the reception of a board and is provided with at least one supporting element protruding substantially perpendicularly to the slot.

The supporting element serves for the reception of indicator components, such for example as luminous diodes or lamps, and can also accommodate circuit elements, which if fitted laterally on the circuit board would be only poorly accessible, if at all, to operating personnel.

Thus in a simple manner, it is possible to mount elements which must be visible and/or operable from the access side, without fitting additional retainers and the like on the conductor plate. Such elements can be mounted simply on the push-on handle, which has to be provided in any case.

The supporting element can extend over the whole width of the push-on handle or may be provided in individual sectors.

The push-on handle can be adapted to special requirements by providing a securing means, for attaching the supporting element to the handle, on the handle and/or on the supporting element. In this way, the supporting element can be fitted or removed according to requirement and supporting elements can also be completely replaced for the purpose of replacing defective parts thereon.

One or more supporting elements may be provided on one side only or supporting elements may be elements on both sides of the handle.

The supporting element may be secured upon and removed from the push-on handle in an especially simple manner, if the securing device comprises a rib extending in the longitudinal direction of the handle and a complementary groove which engages the rail in shape-locking manner. The supporting element can then simply be pushed laterally on to the push-on handle. The push-on handle can be produced from synthetic plastics material and by the extrusion method, if the groove and the rail extend parallel with the slot in the longitudinal direction of the handle.

DESCRIPTION OF EXEMPLARY FORMS OF THE INVENTION

Figure 1:
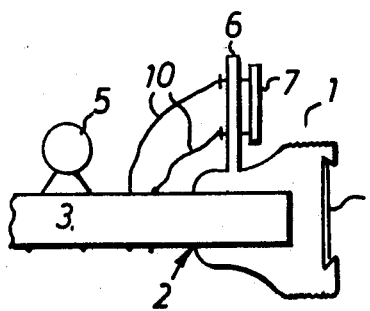
FIG. 1 is a side elevation of one form of push-on handle embodying the invention.
Figure 2:
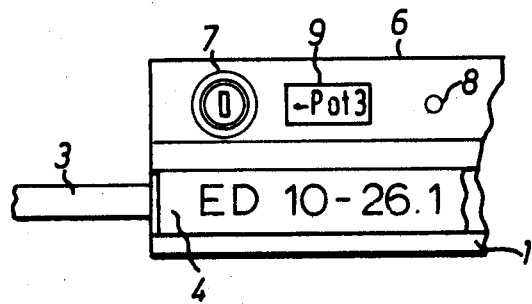
FIG. 2 is a front view of the push-on handle according to FIG. 1.

Referring to FIGS. 1 and 2, a push-on handle 1 has a slot 2 for the reception of a circuit board 3. The board 3 can be secured in the slot 2 by adhesion or otherwise mechanically. On the face of the handle 1, in a recess of dovetail form, a label 4 is provided which serves for the inscription and marking of the conductor plate 3. As represented diagrammatically, electronic components, such for example as a capacitor 5 are arranged in known manner on the circuit board 3.

A supporting element 6 protrudes approximately at right angles from the handle 1, on which element components, such as a potentiometer 7 and a luminous diode 8, are mounted. The supporting element 6 carries, on its side facing the front of the handle 1, an additional marking label 9 which serves for the special marking of for example the potentiometer 7. The potentiometer 7 and the luminous diode 8 are connected through leads 10 with the circuit provided on the circuit board 3.

As may be seen both the marking label 9 and the luminous diode 8 will be visible even when the circuit board, in its installed condition, is arranged for example, directly beside adjacent circuit boards or housing parts and the electronic components such as the capacitor 5 provided on the circuit board 3 itself are neither visible nor accessible. Similarly the potentiometer 7 is readily accessible and operable when the circuit board is in the installed condition.

The supporting element 6, provided in accordance with the invention, both facilitates the arrangement of additional marking elements on circuit boards and makes possible access to operating elements which hitherto could only be actuated in the dismantled condition. Since the handle 1 has in any case to be secured on the conductor plate 3, this is possible without extra expense.

Figure 3:
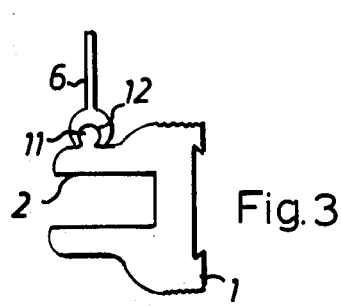
FIG. 3 is a side elevation of a modified form of push-on handle according to the invention.

FIG. 3 shows a modified handle 1 in which a lateral rail 11 extends parallel with the slot. The supporting element 6 has a complementary groove 12 on one edge so that it can be pushed in shape-locking manner upon the rail 11 and can thus be secured to the handle 1. In this way, the supporting element 6 can be provided or removed as desired according to a particular requirement. The supporting element 6 may be provided over the whole length of the handle 1 or short pieces of a supporting element 6 may be pushed on by sections, in order to arrange components or marking lables thereon.

Figure 4:
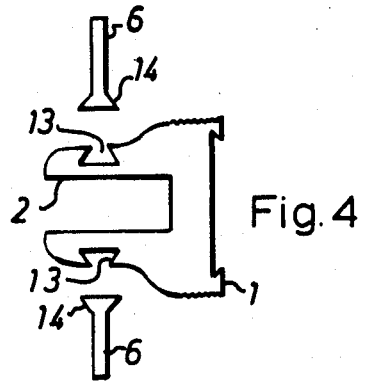
FIG. 4 is a side elevation of a further modified form of push-on handle according to the invention.

FIG. 4 shows a further example of handle in which grooves 13 provided in the handle 1 are engaged by complementary rails 14 provided on two supporting elements 6. The supporting elements 6 and the handle 1 can of course be secured in any suitable way, for example by adhesion or screw attachment, without thereby departing from the scope of the invention.

I claim:

1. A push-on handle for a circuit board to be carried by the handle comprising, an elongated member formed longitudinally on one side thereof with a slot to receive said circuit board, at least one securing means formed longitudinally on said elongated member at one side of said slot, said securing means being formed for receipt of a supporting element from said elongated member protruding laterally therefrom, said handle having a generally constant cross section in longitudinal direction and being formed by extrusion.

2. A push-on handle according to claim 1 in which said supporting element is formed and fixed to protrude from said push-on handle at substantially right angles to the slot.

3. A push-on handle according to claim 1 in which said securing means comprises a rail-like-member extending in the longitudinal direction of the handle and a complementary groove on said supporting element being formed for receipt of said rail-like member in shape-locking manner.

4. A push-on handle as claimed in claim 1, wherein said supporting element is removably secured to said handle by securing means.

5. A push-on handle as claimed in claim 1, wherein said supporting element and said handle are connected together by complementary inter-engaging ribs and grooves.

* * * * *